(12) United States Patent
Sakamoto

(10) Patent No.: US 9,036,131 B2
(45) Date of Patent: May 19, 2015

(54) EXPOSURE APPARATUS AND DEVICE FABRICATION METHOD

(75) Inventor: Noritoshi Sakamoto, Shimotsuga-gun (JP)

(73) Assignee: CANON KABUSHIKI KAISHA (JP)

( * ) Notice: Subject to any disclaimer, the term of this patent is extended or adjusted under 35 U.S.C. 154(b) by 468 days.

(21) Appl. No.: 13/465,099

(22) Filed: May 7, 2012

(65) Prior Publication Data

US 2012/0287412 A1 Nov. 15, 2012

(30) Foreign Application Priority Data

May 10, 2011 (JP) ................... 2011-105652

(51) Int. Cl.
*G03B 27/54* (2006.01)
*G03F 9/00* (2006.01)

(52) U.S. Cl.
CPC ............ *G03F 9/7096* (2013.01); *G03F 9/7069* (2013.01)

(58) Field of Classification Search
CPC ....... G03F 7/20; G03F 9/7065; G03F 9/7049; G03F 9/7069; G03F 7/7096
USPC ............. 355/52, 53, 55, 67–71; 356/399–401
See application file for complete search history.

(56) References Cited

U.S. PATENT DOCUMENTS

| | | | |
|---|---|---|---|
| 4,694,186 A | 9/1987 | Onoda et al. | |
| 6,304,319 B1 * | 10/2001 | Mizutani | 355/69 |
| 6,582,978 B2 * | 6/2003 | Shiraishi | 438/16 |
| 6,870,623 B2 | 3/2005 | Tanaka et al. | |
| 7,551,281 B2 * | 6/2009 | Sato et al. | 356/364 |
| 2008/0144047 A1 * | 6/2008 | Hayashi | 356/620 |

FOREIGN PATENT DOCUMENTS

| | | |
|---|---|---|
| JP | 61-67223 A | 4/1986 |
| JP | 10135117 A | 5/1998 |
| JP | 11-67660 A | 3/1999 |
| JP | 2003-092248 A | 3/2003 |

* cited by examiner

*Primary Examiner* — Hung Henry Nguyen
(74) *Attorney, Agent, or Firm* — Rossi, Kimms & McDowell LLP

(57) ABSTRACT

The present invention provides an exposure apparatus including a measurement unit configured to measure a position of the mark on a substrate, and a control unit configured to control an amount of light on a predetermined plane of an optical system included in the measurement unit, wherein an amount of light emitted by a light source is smaller in a non-measurement period in which the position of the mark is not measured than in a measurement period in which the position of the mark is measured, and the control unit sets a transmittance in an optical path between the light source and the predetermined plane to be higher in the non-measurement period than in the measurement period.

21 Claims, 8 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

In recent years, as techniques of fabricating semiconductor devices, microfabrication techniques have made remarkable progress. In the optical processing technology (photolithography), an exposure apparatus having a resolution on the submicron order has become the mainstream. To further improve the resolution, the numerical aperture (NA) of a projection optical system is increased and the wavelength of exposure light is shortened. As the wavelength of exposure light shortens, a light source used in an exposure apparatus shifts from a high-pressure mercury lamp which uses the g-line or i-line to, for example, a KrF excimer laser or an ArF excimer laser. However, as the wavelength of exposure light shortens, the type of usable glass material is limited, so it becomes more difficult to correct the chromatic aberration of a projection optical system for the wavelength of alignment light. Hence, the recent exposure apparatus often employs an off-axis alignment optical system (OA optical system) that is not adversely affected by the chromatic aberration of a projection optical system.

In a projection optical system and OA optical system, a change in temperature is known to adversely affect the imaging performance and alignment performance (that is, degrade the imaging performance and alignment performance). Hence, to suppress degradation in alignment performance due to a change in temperature in the vicinity of a sensor in the OA optical system, Japanese Patent Laid-Open No. 10-135117 proposes a technique of enclosing the sensor using an enclosing member having a predetermined airtightness to control the temperature in this enclosing member. In the technique described in Japanese Patent Laid-Open No. 10-135117, during exposure, heat propagated from, for example, a projection optical system, substrate, or reticle (mask) is shielded using the enclosing member, and the temperature in this enclosing member is controlled, thereby maintaining the temperature in the vicinity of the sensor constant.

Also, the OA optical system generally uses, for example, a halogen lamp (wide wavelength band light source) as an alignment light source, and selects a wavelength band used for measurement from a plurality of wavelength bands in accordance with, for example, the measurement conditions. The halogen lamp is known to have a positive correlation between the ON voltage and the life: the life is shorter when the ON voltage is relatively high than when the ON voltage is relatively low. Therefore, in the OA optical system, to achieve both a long life and energy saving, the halogen lamp is turned on at a relatively high ON voltage to ensure a required illuminance in the measurement period, and is turned on at a relatively low ON voltage in the non-measurement period (that is, the amount of light is set relatively small in the non-measurement period). Also, in the OA optical system, alignment light from the alignment light source is guided to an optical system (sensor) of the OA optical system via a fiber. This is to separate the optical system of the OA optical system and the alignment light source as a heat source to prevent expansion/contraction of the optical system of the OA optical system due to a change in temperature, thereby suppressing degradation in alignment performance.

However, since the alignment light guided via the fiber contains energy as well, the optical system of the OA optical system expands/contracts upon irradiation with the alignment light, thus hindering the OA optical system from ensuring high alignment performance required these days. Especially in the OA optical system, the ON voltage of the halogen lamp is changed between the measurement period (during measurement) and the non-measurement period (during non-measurement), the amount of alignment light (amount of heat) which enters the OA optical system is different between the measurement period and the non-measurement period. As a result, the change in temperature of the OA optical system in the measurement period is considerable, and this adversely affects the alignment performance of the OA optical system.

Although it is also possible to apply the technique described in Japanese Patent Laid-Open No. 10-135117 so that the optical system of the OA optical system is enclosed to control the temperature in this optical system, a temperature control mechanism, for example, is additionally required, leading to increases in size and cost of the configuration of the OA optical system.

SUMMARY OF THE INVENTION

The present invention provides a technique advantageous in reducing a change in temperature of a measurement unit (its optical system) in the measurement period.

According to one aspect of the present invention, there is provided an exposure apparatus which exposes a substrate to light, the apparatus comprising: a measurement unit which includes an optical system configured to illuminate a mark on the substrate with light emitted by a light source to form an image of the mark using the light reflected by the mark, and a detection system configured to detect the image of the mark, and is configured to measure a position of the mark on the substrate; and a control unit configured to control an amount of light on a predetermined plane of the optical system, wherein an amount of light emitted by the light source is smaller in a non-measurement period in which the position of the mark is not measured than in a measurement period in which the position of the mark is measured, and the control unit sets a transmittance in an optical path between the light source and the predetermined plane to be higher in the non-measurement period than in the measurement period.

Further features of the present invention will become apparent from the following description of exemplary embodiments with reference to the attached drawings.

DESCRIPTION OF THE EMBODIMENTS

Figure 1:
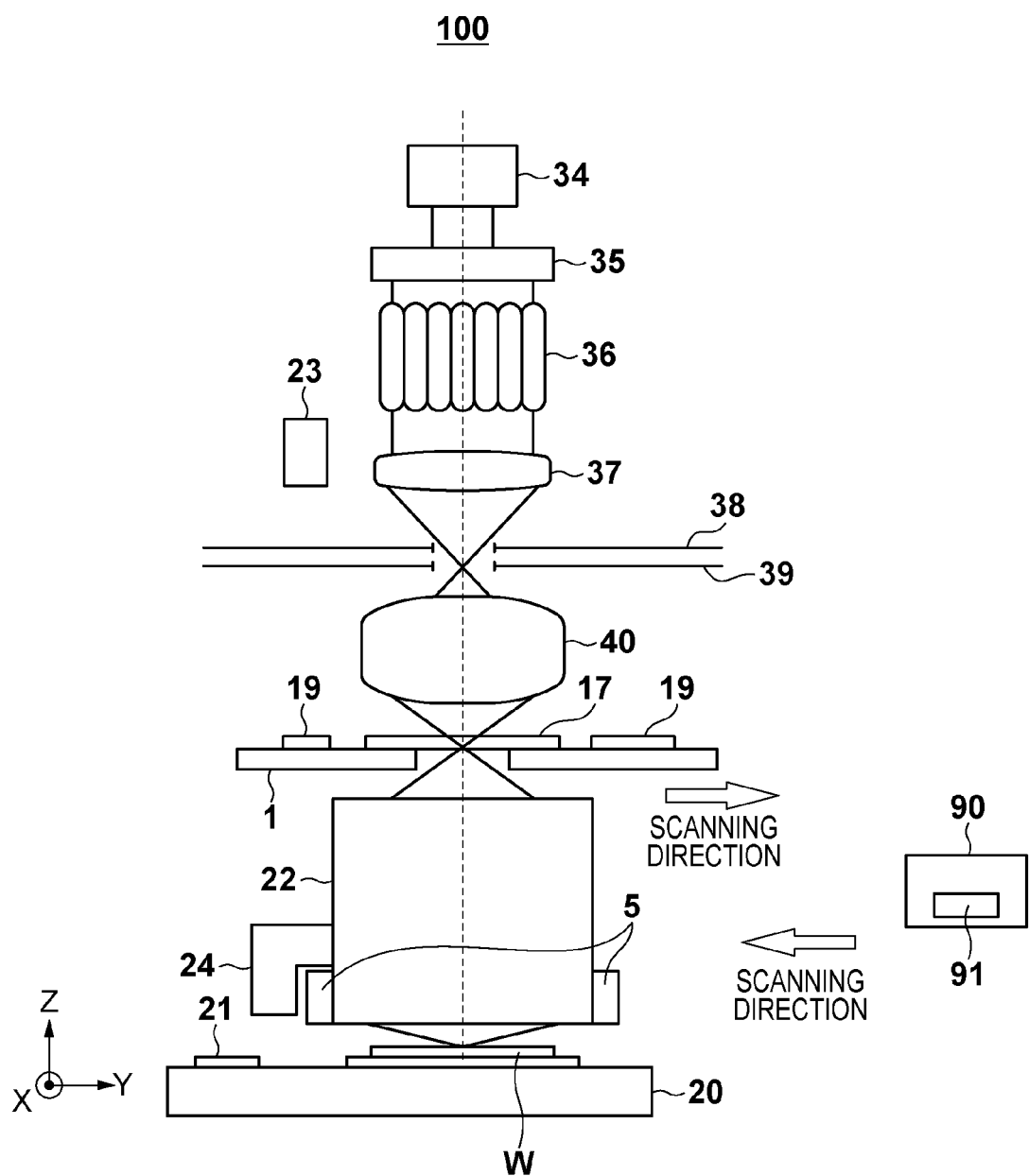
FIG. 1 is a schematic view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the configuration of an exposure apparatus 100 according to an aspect of the present invention. The exposure apparatus 100 transfers the pattern of a reticle 17 onto a wafer W serving as a substrate via a projection optical system 22 (that is, exposes the wafer W to light).

A light source 34 emits light (exposure light) in a predetermined wavelength range. The light source 34 can be, for example, an excimer laser light source which uses, for example, an ArF excimer laser or a KrF excimer laser, a metal vapor laser light source, a pulsed light source such as a high-frequency generator which uses a YAG laser, or a continuous light source which uses a mercury lamp and an elliptical reflecting mirror in combination.

In this embodiment, an illumination optical system includes a shaping optical system 35, fly-eye lens 36, condenser lens 37, fixed field stop 38, variable field stop 39, and relay lens 40, and illuminates the reticle 17.

Light from the light source 34 is shaped into light having a predetermined diameter (light beam diameter) by the shaping optical system 35, and reaches the fly-eye lens 36. A large number of secondary light sources are formed on the exit surface of the fly-eye lens 36, are converged by the condenser lens 37, and reach the variable field stop 39 via the fixed field stop 38. Although the fixed field stop 38 is placed on the side of the condenser lens 37 with respect to the variable field stop 39, it may be placed on the side of the relay lens 40 with respect to the variable field stop 39.

In this embodiment, the fixed field stop 38 has a rectangular slit-like opening. Hence, light having passed through the fixed field stop 38 is converted into light having a rectangular slit-like cross-section, and enters the relay lens 40. The relay lens 40 serves to make the variable field stop 39 and the reticle 17 (its pattern surface) conjugate to each other.

The projection optical system 22 includes a dioptric system, catadioptric system, or catoptric system, and projects the pattern of the reticle 17 (its image) in a slit-like illumination region formed by the illumination optical system onto the wafer W. The reticle 17 is held and driven by a reticle stage 1.

The wafer W is a substrate onto which the pattern of the reticle 17 is projected. The wafer W is transported by a wafer transport system (not shown) and held and driven by a wafer stage 20. The wafer stage 20 includes an X-Y stage for positioning the wafer W within a plane perpendicular to the optical axis of the projection optical system 22 and scanning the wafer W in the ±Y directions, and a Z stage for positioning the wafer W in the Z direction.

An off-axis alignment optical system (OA optical system) 24 is a measurement unit which measures the position of a mark on the wafer W and that of a mark on the wafer stage 20. The OA optical system 24 includes an optical system which illuminates the mark on the wafer W with light emitted by an alignment light source to form an image of the mark using the light reflected by the mark, and a detection system which detects the image of the mark, as will be described later.

A control unit 90 includes a CPU and a storage unit 91 formed by, for example, a memory, and controls the overall exposure apparatus 100 (its operation). The control unit 90 controls (switches), for example, ON/OFF of exposure. More specifically, if the light source 34 is a pulsed light source, the control unit 90 controls power supplied from a power supply for the pulsed light source to control ON/OFF of exposure. However, if the light source 34 is a continuous light source, the control unit 90 opens/closes a shutter (not shown) placed in the optical path of the illumination optical system to control ON/OFF of exposure. Note that in this embodiment, since the illumination optical system includes the variable field stop 39 serving as a movable blind, ON/OFF of exposure can be controlled by opening/closing the variable field stop 39. The control unit 90 also controls, for example, a measurement process of measuring the baseline of the OA optical system 24 and a measurement process which uses the OA optical system 24.

A measurement process of measuring the baseline of the OA optical system 24 will be described with reference to FIG. 2. Reticle reference marks 33 for positioning between the reticle 17 and the reticle stage 1 are formed on the reticle 17, and a reference plate 19 on which a baseline measurement mark is formed is placed on the reticle stage 1. Also, the reticle 17 is positioned relative to the reticle stage 1 in advance by detecting the reticle reference marks 33 using an alignment optical system (not shown).

Figure 2:
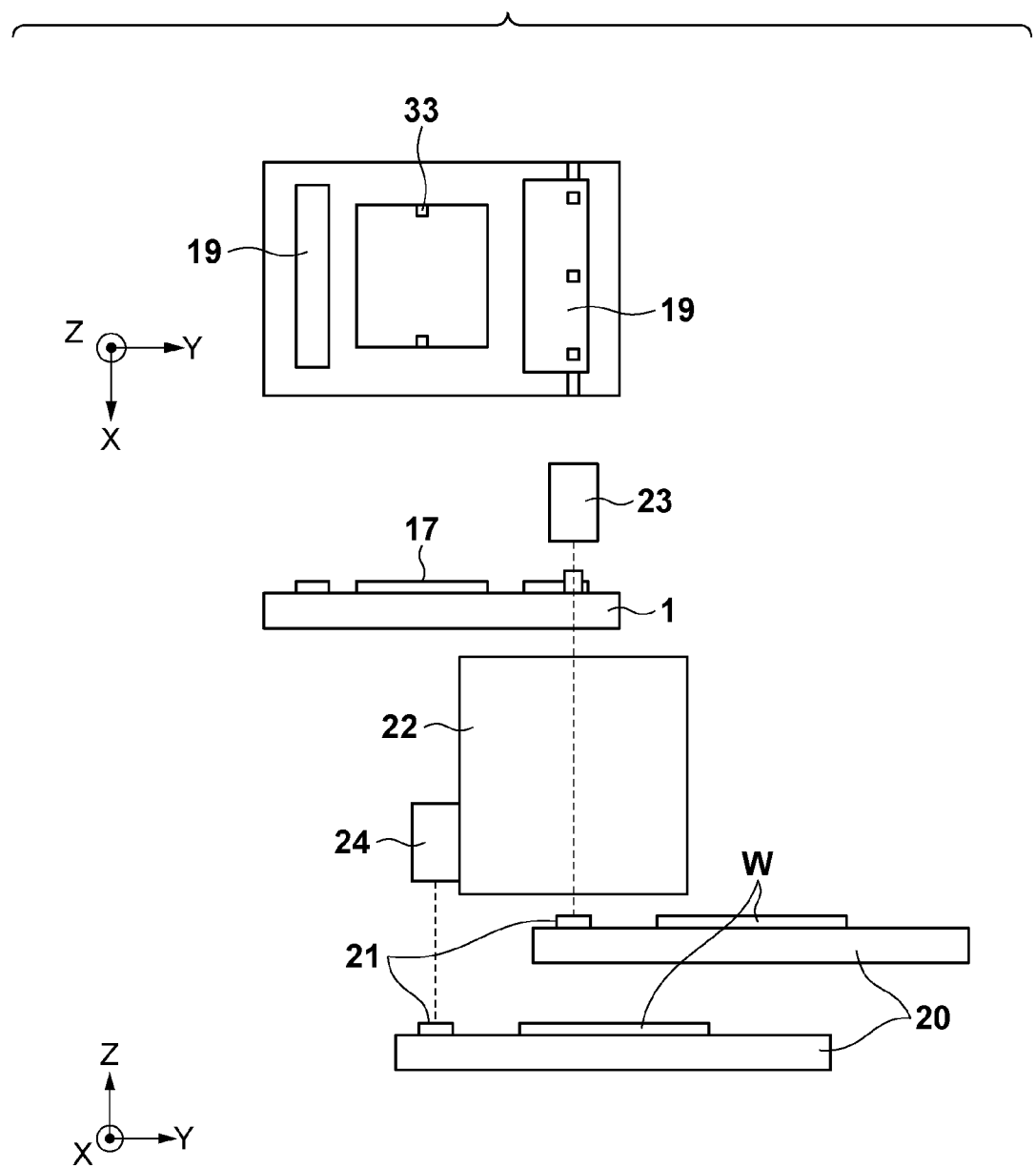
FIG. 2 is a view for explaining a measurement process of measuring the baseline of an OA optical system.

First, as shown in FIG. 2, the relative position between the baseline measurement mark formed on the reference plate 19 and a stage reference mark 21 formed on the wafer stage 20 is detected by an alignment optical system 23 via the projection optical system 22.

The wafer stage 20 is driven to position the stage reference mark 21 in the measurement region of the OA optical system 24. The relative position between the stage reference mark 21 and a reference mark SM of the OA optical system 24 is detected by the OA optical system 24.

A baseline (amount of baseline) is calculated from the detection result of the relative position between the baseline measurement mark and the stage reference mark 21, and that of the relative position between the stage reference mark 21 and the reference mark SM. Upon this operation, the measurement position of the OA optical system 24 relative to the optical axis (the center of exposure) of the projection optical system 22 is obtained.

Figure 3:
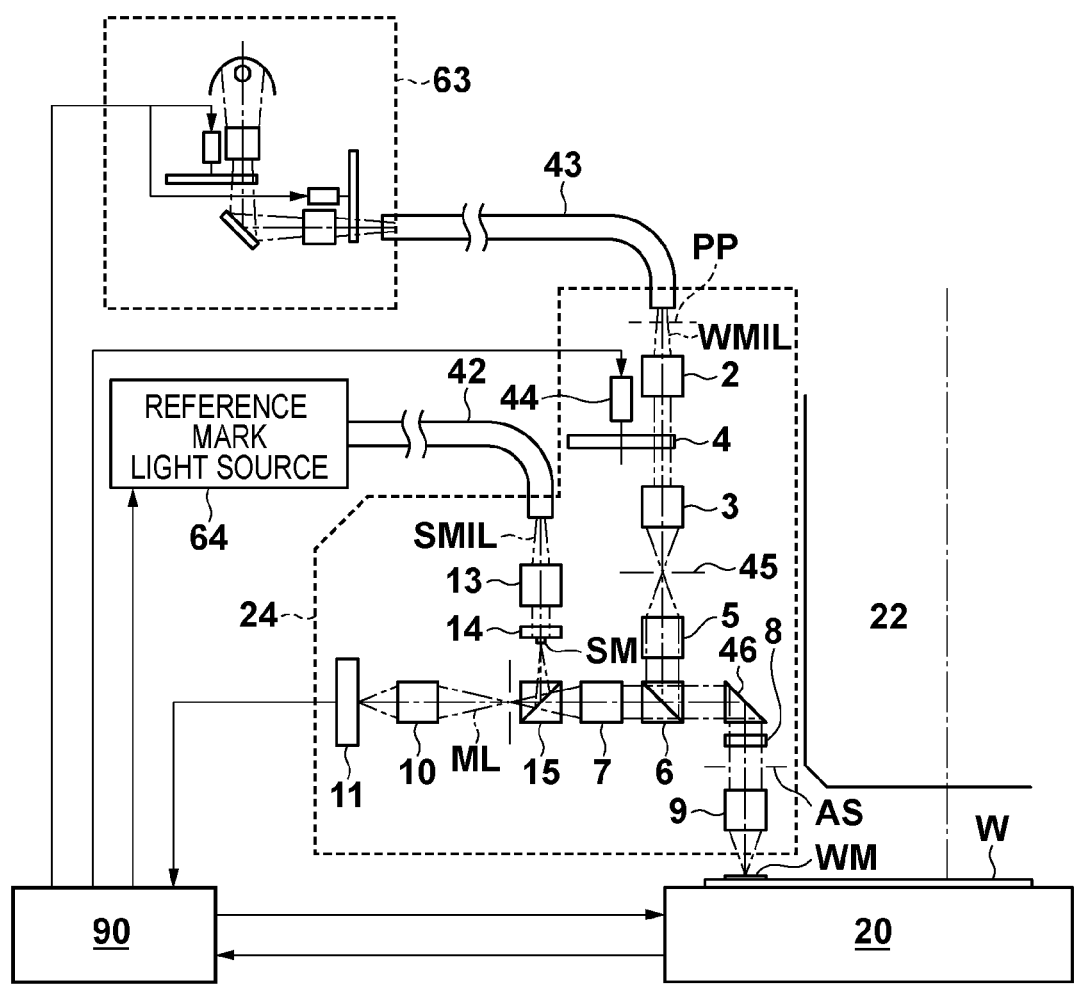
FIG. 3 is a schematic view showing the configuration of the OA optical system.

The OA optical system 24 will be described in detail below. FIG. 3 is a schematic view showing the configuration of the OA optical system 24. In this embodiment, a halogen lamp is used as an alignment light source 63. The alignment light source 63 includes a heat source (the heating element of the halogen lamp), and is therefore spaced apart from an optical system which includes the OA optical system 24 that requires temperature stability.

Light (wafer mark illumination light) WMIL from the exit end of a fiber 43 passes, via an illumination relay lens 2, through an illumination aperture stop placed in the optical path of the OA optical system 24 among a plurality of illumination aperture stops arranged on a turret 4. An illumination aperture stop to be placed in the optical path of the OA optical system 24 can be selected by driving (rotating) the turret 4 using a motor 44. More specifically, when conditions (measurement conditions) defined by a combination of an illumination aperture stop 45 and the wavelength and amount of light from the alignment light source 63 are set, the control unit 90 obtains the amount of driving (the rotation rate of the turret 4) from the origin of rotation of the motor 44. The control unit 90 drives the motor 44 in accordance with this amount of driving to place, in the optical path of the OA optical system 24, a predetermined illumination aperture stop among the plurality of illumination aperture stops arranged on the turret 4. Note that the origin of rotation of the motor 44 is a position at which, for example, a slit formed in the turret 4 passes through a detection unit of a photo-switch and must be obtained in advance by rotating the turret 4 through 360° using the motor 44.

The light WMIL having passed through the illumination aperture stop illuminates the illumination aperture stop 45 via an illumination relay lens 3. The light WMIL having passed through the illumination aperture stop 45 further passes through an illumination optical system 5 and enters a polarizing beam splitter 6. The polarizing beam splitter 6 reflects a P-polarized component (a component parallel to the paper surface of FIG. 3) of the light WMIL. Note that the polarizing beam splitter 6 is used to detect light in a detection unit 11 with high efficiency, and therefore may be replaced with a half mirror as long as a given amount of light can be ensured.

The light WMIL reflected by the polarizing beam splitter 6 is reflected by a reflecting prism 46, and enters a λ/4 plate 8 placed in the optical path between the reflecting prism 46 and the wafer W. The light WMIL having passed through the λ/4 plate 8 is converted into circularly polarized light, and illuminates a wafer mark WM on the wafer W via an imaging aperture stop AS and an objective lens 9.

Light (imaging light) ML reflected by the wafer mark WM passes through the objective lens 9, imaging aperture stop AS, and λ/4 plate 8. The light ML having passed through the λ/4 plate 8 is converted from circularly polarized light into linearly polarized light (S-polarized light in a direction perpendicular to the paper surface of FIG. 3, and is transmitted through the polarizing beam splitter 6 via the reflecting prism 46. The light transmitted through the polarizing beam splitter 6 is guided to a relay lens 7. The relay lens 7 forms an image of the wafer mark WM once. The image of the wafer mark WM formed by the relay lens 7 forms through a detection optical system 10 an image again on the detection surface of the detection unit 11 formed by, for example, a CCD sensor or a CMOS sensor (that is, an image of the wafer mark WM is formed by the light ML again). A wafer mark signal corresponding to the image of the wafer mark WM detected by the detection unit 11 is input to the control unit 90.

On the other hand, light (reference mark illumination light) SMIL for illuminating the reference mark SM of the OA optical system 24 is guided from a reference mark light source 64 via a fiber 42. The light SMIL from the exit end of the fiber 42 Kohler-illuminates a reference plate 14 via a reference plate illumination optical system 13 (that is, the light SMIL illuminates the reference plate 14 with a uniform light amount distribution). The reference mark SM is formed on the reference plate 14. The light having passed through the reference mark SM is reflected by a half mirror 15 and guided to the detection unit 11. A reference mark signal corresponding to the image of the reference mark SM detected by the detection unit 11 is input to the control unit 90.

The control unit 90 calculates the position of the wafer W (that is, the position of the wafer stage 20) from the wafer mark signal and reference mark signal to drive the wafer stage 20 and position the wafer W based on the calculation result. In this way, the control unit 90 functions as a positioning mechanism which positions the wafer W in cooperation with the wafer stage 20.

Figure 4:
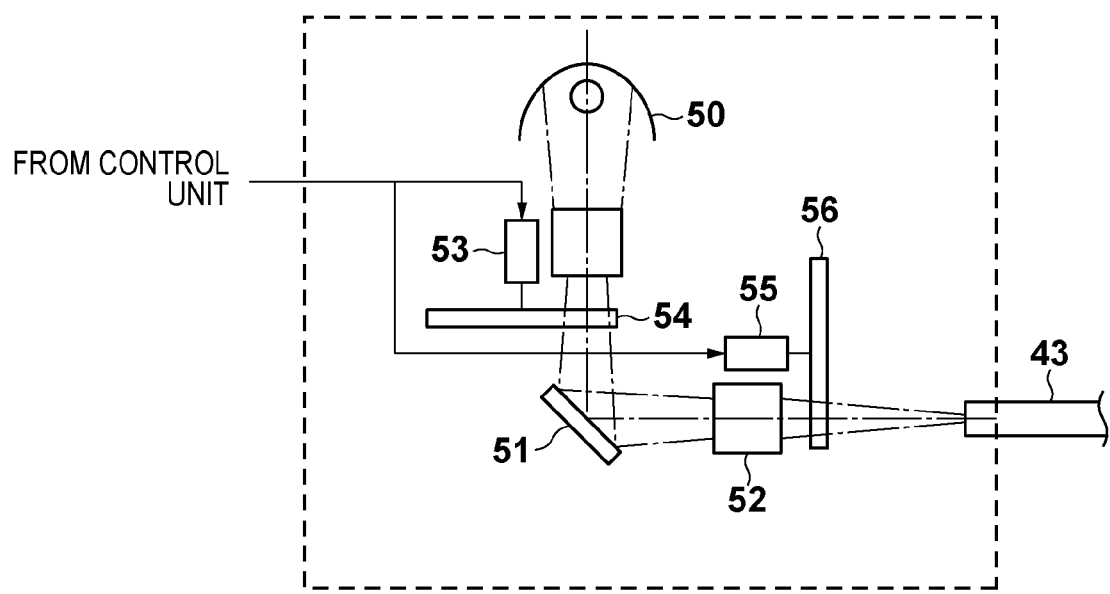
FIG. 4 is a schematic view showing a configuration in the vicinity of an alignment light source.

A configuration in the vicinity of the alignment light source 63 will be described with reference to FIG. 4. FIG. 4 is a schematic view showing a configuration in the vicinity of the alignment light source 63. The OA optical system 24 uses a halogen lamp 50 as the alignment light source 63, as described above. The halogen lamp 50 has a positive correlation between the ON voltage and the life: the life is shorter when the ON voltage is relatively high than when the ON voltage is relatively low. Also, a mirror 51 and an optical system 52 which focuses light from the halogen lamp 50 on the exit end of the fiber 43 are arranged near the alignment light source 63. A wavelength filter turret 54 driven (rotated) by a motor 53, and a neutral density filter turret 56 driven (rotated) by a motor 55 are also arranged near the alignment light source 63.

A plurality of wavelength filters which transmit light beams having different wavelengths are arranged on the wavelength filter turret 54 as filters for selecting the wavelengths of light emitted by the halogen lamp 50. A wavelength filter to be placed in the optical path of the OA optical system 24 can be selected by driving (rotating) the wavelength filter turret 54 using the motor 53. Also, neutral density filters (ND filters) having different transmittances are arranged on the neutral density filter turret 56 as filters for reducing the amount of light. An ND filter to be placed in the optical path of the OA optical system 24 can be selected by driving (rotating) the neutral density filter turret 56 using the motor 55.

Figure 5A:
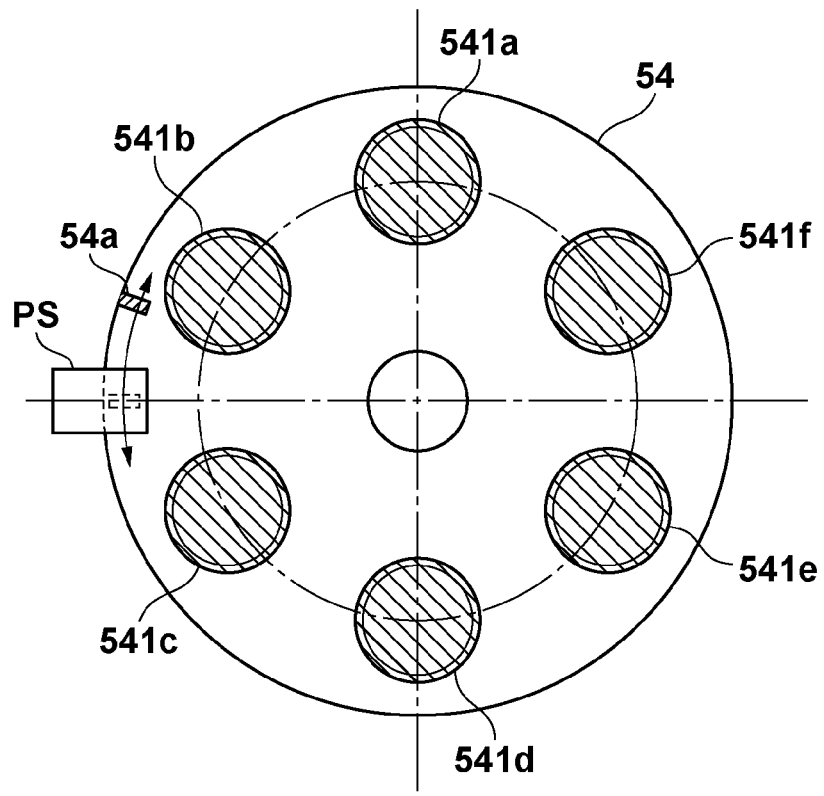
FIGS. 5A and 5B are views showing the configurations of a wavelength filter turret and wavelength filters.
Figure 5B:
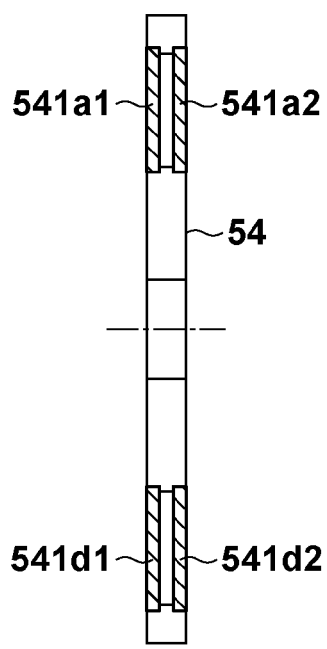

FIGS. 5A and 5B are views showing the configurations of the wavelength filter turret 54 and wavelength filters 541a to 541f, in which FIG. 5A illustrates a front view, and FIG. 5B illustrates a sectional view. In this embodiment, the six wavelength filters 541a to 541f which transmit light beams having different wavelengths are arranged on the wavelength filter turret 54, as shown in FIG. 5A. In this embodiment, the wavelength filter 541a is formed using a long-wavelength cut filter 541a1 and short-wavelength cut filter 541a2 in combination, as shown in FIG. 5B. The long-wavelength cut filter 541a1 has a function of cutting off light having wavelengths longer than a given wavelength, and the short-wavelength cut filter 541a2 has a function of cutting off light having wavelengths shorter than the given wavelength. Therefore, the wavelength of light which is transmitted through (selected by) the wavelength filter 541a can be set by a combination of the long-wavelength cut filter 541a1 and the short-wavelength cut filter 541a2. The origin of rotation of the motor 53 is a position at which, for example, a slit 54a formed in the wavelength filter turret 54 passes through a detection unit of a photo-switch PS, and can be obtained by rotating the wavelength filter turret 54 through 360° using the motor 53. Note that the wavelength filters 541b to 541f have the same configuration as the wavelength filter 541a, and a detailed description thereof will not be given herein.

Figure 6:
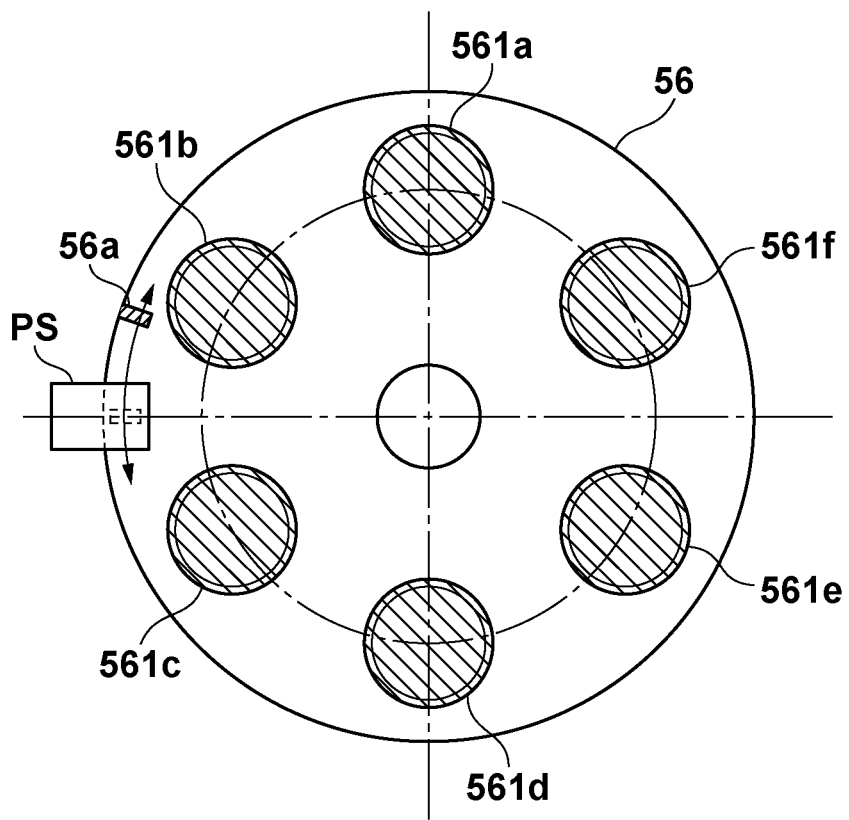
FIG. 6 is a view showing the configuration of a neutral density filter turret and neutral density filters.

FIG. 6 is a view showing the configurations of the neutral density filter turret 56 and ND filters 561a to 561f. In this embodiment, the six ND filters 561a to 561f having different transmittances are arranged on the neutral density filter turret 56, as shown in FIG. 6. Also, the origin of rotation of the motor 55 is a position at which, for example, a slit 56a formed in the ND filter turret 56 passes through a detection unit of a photo-switch PS, and can be obtained by rotating the ND filter turret 56 through 360° using the motor 55.

In this embodiment, the control unit 90 controls the amount of light emitted by the halogen lamp 50 to achieve both a long life and energy saving of the halogen lamp 50. In other words, the control unit 90 turns on the halogen lamp 50 at a high ON voltage to ensure a required illuminance in the measurement period in which the OA optical system 24 performs a measurement process (for example, it measures the position of the wafer mark WM). On the other hand, the control unit 90 turns on the halogen lamp 50 at a low ON voltage in the non-measurement period in which the OA optical system 24 does not perform a measurement process (for example, it does not measure the position of the wafer mark WM). In other words, the control unit 90 controls the ON voltage of the halogen lamp 50 so that the amount of light emitted by the halogen lamp 50 is smaller in the non-measurement period than in the measurement period. However, when the ON voltage of the halogen lamp 50 is changed between the measurement period (during measurement) and the non-measurement period (during non-measurement), the amount of light incident on a predetermined plane PP (see FIG. 3) in a downstream optical system which constitutes the OA optical system 24 is different between the measurement period and the non-measurement period. Hence, the control unit 90 reduces the difference between the amount of light incident on the predetermined plane PP in the measurement period and that of light incident on the predetermined plane PP in the non-measurement period so that a change in temperature on the predetermined plane PP in the measurement period falls within a tolerance. In this embodiment, the control unit 90 sets the transmittance in the optical path between the halogen lamp 50 and the predetermined plane PP to be higher in the non-measurement period than in the measurement period. This can be implemented using the wavelength filter turret 54 and wavelength filters 541a to 541f or the neutral density filter turret 56 and ND filters 561a to 561f.

The control of the amount of light on the predetermined plane PP by the control unit 90 will be described by giving concrete numerical values. Assume, for example, that the wavelength filters 541a, 541b, 541c, 541d, and 541e have transmittances of 40%, 50%, 60%, 70%, and 80%, respectively. Assume also that the ON voltage of the halogen lamp 50 in the measurement period is defined as Vm [V], the wavelength filter 541b is placed in the optical path of the OA optical system 24 in the measurement period, and the ON voltage of the halogen lamp 50 in the non-measurement period is 0.625 Vm [V]. Note that the ND filter placed in the optical path of the OA optical system 24 remains unchanged between the measurement period and the non-measurement period (that is, the transmittance of the ND filter stays constant).

Let N [%] be the transmittance of the wavelength filter to be placed in the optical path of the OA optical system 24 in the non-measurement period. Because the amount of light emitted by the halogen lamp 50 is nearly proportional to the ON voltage, an amount Wm of light emitted by the halogen lamp 50 in the measurement period is given by:

$$Wm = 50[\%]/100[\%] \times Vm[V] \quad (1)$$

Also, an amount Wnm of light emitted by the halogen lamp 50 in the non-measurement period is given by:

$$Wnm = N[\%]/100[\%] \times 0.625\ Vm[V] \quad (2)$$

From equations (1) and (2), to set the amount of light on the predetermined plane PP to be equal in the measurement period and the non-measurement period, the wavelength filter to be placed in the optical path of the OA optical system 24 in the non-measurement period has a transmittance N [%] of 80 [%]. Therefore, from the wavelength filters 541a to 541f arranged on the wavelength filter turret 54, the wavelength filter 541e having a transmittance of 80 [%] need only be selected as the wavelength filter to be placed in the optical path of the OA optical system 24 in the non-measurement period. In other words, the wavelength filter 541e having a transmittance higher than that of the wavelength filter 541b placed in the optical path of the OA optical system 24 in the measurement period is placed in the optical path of the OA optical system 24 in the non-measurement period. Upon this operation, even if the ON voltage of the halogen lamp 50 is set relatively low in the non-measurement period, the amount of light on the predetermined plane PP can be set equal in the measurement period and the non-measurement period. As a result, a change in temperature of the OA optical system 24 in the measurement period can be reduced (that is, a change in temperature of the OA optical system 24 falls within a tolerance), thereby allowing the OA optical system 24 to maintain high alignment performance.

Note that if a wavelength filter having a transmittance of 80 [%] is not placed on the wavelength filter turret 54, a wavelength filter having a transmittance closest to 80 [%], that is, the wavelength filter 541d having a transmittance of 70 [%] in this embodiment is selected. In other words, a wavelength filter which brings the amount of light on the predetermined plane PP in the non-measurement period close to that of light on the predetermined plane PP in the measurement period need only be selected from a plurality of wavelength filters and placed in the optical path of the OA optical system 24.

In the above-mentioned example, the wavelength filter is changed without changing the ND filter (while maintaining the transmittance of the ND filter constant) to set the amount of light on the predetermined plane PP to be equal in the measurement period and the non-measurement period. However, the amount of light on the predetermined plane PP can similarly be set equal in the measurement period and the non-measurement period by changing the ND filter without changing the wavelength filter, that is, by using the ND filters 561a to 561f.

Assume, for example, that the wavelength filter 541a is kept placed in the optical path of the OA optical system 24 between the measurement period and the non-measurement period, that is, the wavelength filter remains unchanged between these periods. Assume also that the ON voltage of the halogen lamp 50 in the measurement period is defined as Vm [V], the ND filter placed in the optical path of the OA optical system 24 in the measurement period has a transmittance of 50 [%], and the ON voltage of the halogen lamp 50 in the non-measurement period is 0.625 Vm [V].

Let M [%] be the transmittance of the ND filter to be placed in the optical path of the OA optical system 24 in the non-measurement period. Because the amount of light emitted by the halogen lamp 50 is nearly proportional to the ON voltage, an amount Wm of light emitted by the halogen lamp 50 in the measurement period is given by:

$$Wm = 40[\%]/100[\%] \times 50[\%]/100[\%] \times Vm[V] \quad (3)$$

Also, an amount Wnm of light emitted by the halogen lamp 50 in the non-measurement period is given by:

$$Wnm = 40[\%]/100[\%] \times M[\%]/100[\%] \times 0.625\ Vm[V] \quad (4)$$

From equations (3) and (4), to set the amount of light on the predetermined plane PP to be equal in the measurement period and the non-measurement period, the ND filter to be placed in the optical path of the OA optical system 24 in the non-measurement period has a transmittance M [%] of 80 [%]. Therefore, from the ND filters 561a to 561f arranged on the neutral density filter turret 56, an ND filter having a transmittance of 80 [%] need only be selected as the ND filter to be placed in the optical path of the OA optical system 24 in the non-measurement period. In other words, an ND filter having a transmittance higher than that of the ND filter placed in the optical path of the OA optical system 24 in the measurement period is placed in the optical path of the OA optical system 24 in the non-measurement period. Upon this operation, even if the ON voltage of the halogen lamp 50 is set relatively low in the non-measurement period, the amount of light on the predetermined plane PP can be set equal in the measurement period and the non-measurement period. As a result, a change in temperature of the OA optical system 24 in the measurement period can be reduced (that is, a change in temperature of the OA optical system 24 falls within a tolerance), thereby allowing the OA optical system 24 to maintain high alignment performance.

Note that if an ND filter having a transmittance of 80 [%] is not placed on the neutral density filter turret 56, an ND filter having a transmittance closest to 80 [%] is selected. In other words, an ND filter which brings the amount of light on the predetermined plane PP in the non-measurement period close to that of light on the predetermined plane PP in the measurement period need only be selected from a plurality of ND filters and placed in the optical path of the OA optical system 24.

In this embodiment, the wavelength filter or the ND filter is changed between the measurement period and the non-measurement period. However, both the wavelength filter and the ND filter may be changed to set the amount of light on the predetermined plane PP to be equal in the measurement period and the non-measurement period.

Also, to achieve both a long life and energy saving of the halogen lamp 50, it is sometimes desired to maximize the amount of light on the predetermined plane PP (the transmittance in the optical path between the halogen lamp 50 and the predetermined plane PP) in the non-measurement period. In such a case, openings (transmittance: 100 [%]) can be formed in the wavelength filter turret 54 and neutral density filter turret 56 and set in the optical path of the OA optical system 24 in the non-measurement period. This makes it possible to obtain a larger amount of light on the predetermined plane PP while the ON voltage of the halogen lamp 50 is kept relatively low, thus effectively achieving a long life and energy saving of the halogen lamp 50.

Also, the position of the predetermined plane PP is not limited to that shown in FIG. 3, and can be set to an arbitrary position within the range in which the OA optical system 24 can maintain high alignment performance. If the position of the predetermined plane PP is, for example, downstream of the turret 4 which constitutes the OA optical system 24, the amount of light on the predetermined plane PP can be set equal in the measurement period and the non-measurement period using the plurality of illumination aperture stops arranged on the turret 4. Each illumination aperture stop can limit the amount of light incident on an optical system downstream of it. Therefore, an illumination aperture stop need only be selected so that the amount of light on the predetermined plane PP set downstream of it is equal in the measurement period and the non-measurement period. Note that the present invention is not limited to an illumination aperture stop, and another optical system can be used to set the amount of light on the predetermined plane PP to be equal in the measurement period and the non-measurement period as long as this optical system is placed upstream of the predetermined plane PP and can adjust the amount of light.

The ON voltage of the halogen lamp 50 (the amount of light emitted by the halogen lamp 50) may stay constant between the measurement period and the non-measurement period as long as its life falls within a tolerance.

Also, a resist applied on the wafer W may deteriorate by or be exposed to light emitted by the halogen lamp 50 in the non-measurement period. In such a case, a threshold can be set for the cumulative amount of light on the predetermined plane PP in the non-measurement period so that the amount of light emitted by the halogen lamp 50 is reduced or the halogen lamp 50 is turned off when the cumulative amount of light on the predetermined plane PP becomes equal to or larger than the threshold. Although the threshold can be set to an arbitrary value, a value corresponding to the amount of light which deteriorates or exposes the resist is desirably set.

Figure 7:
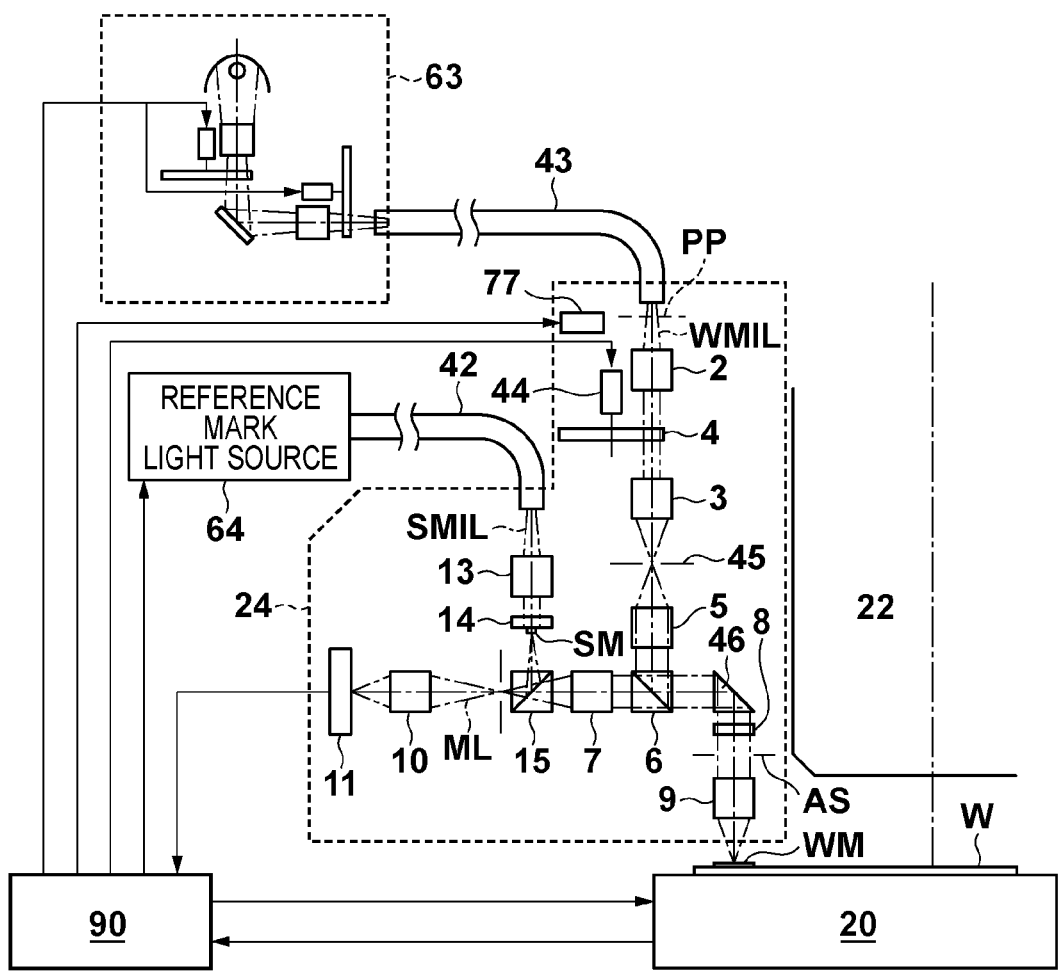
FIG. 7 is a schematic view showing another configuration in the vicinity of the alignment light source.

Moreover, a sensor 77 which detects the temperature in the OA optical system 24 and, more specifically, the temperature on the predetermined plane PP may be placed, as shown in FIG. 7. The sensor 77 always or periodically detects the temperature on the predetermined plane PP, that is, the temperature on the predetermined plane PP in the measurement period and that on the predetermined plane PP in the non-measurement period.

The temperature on the predetermined plane PP detected by the sensor 77 is input to the control unit 90. The control unit 90 controls the amount of light on the predetermined plane PP in the non-measurement period based on the detection result obtained by the sensor 77. The amount of light on the predetermined plane PP can be set equal in the measurement period and the non-measurement period by selecting a wavelength filter or an ND filter, to be placed in the optical path of the OA optical system 24 in the non-measurement period, in accordance with the temperature on the predetermined plane PP. In this way, the amount of light on the predetermined plane PP can be set equal in the measurement period and the non-measurement period with higher accuracy by controlling the amount of light on the predetermined plane PP in the non-measurement period based on the actually detected temperature on the predetermined plane PP.

Note that a sensor which detects the amount of light on the predetermined plane PP instead of the temperature on the predetermined plane PP may be used, and the amount of light on the predetermined plane PP in the non-measurement period may be controlled based on the detection result obtained by the sensor. In this case as well, the amount of light on the predetermined plane PP can be set equal in the measurement period and the non-measurement period by selecting a wavelength filter or an ND filter, to be placed in the optical path of the OA optical system 24 in the non-measurement period, in accordance with the amount of light on the predetermined plane PP.

Also, instead of actually detecting the temperature or the amount of light on the predetermined plane PP, a temporal change in temperature or amount of light on the predetermined plane PP may be stored in advance. For example, information indicating a temporal change in at least one of the temperature and the amount of light on the predetermined plane PP may be stored in the storage unit 91 of the control unit 90, and the amount of light on the predetermined plane PP in the non-measurement period may be adjusted based on the information. The amount of light on the predetermined plane PP can be set equal in the measurement period and the non-measurement period by selecting a wavelength filter or an ND filter, to be placed in the optical path of the OA optical system 24 in the non-measurement period, in accordance with the information stored in the storage unit 91.

Moreover, as described above, even when the wavelength filter or the ND filter to be placed in the optical path of the OA optical system 24 is changed between the measurement period and the non-measurement period, a fluctuation or an offset may occur in the measurement result of the OA optical system 24. In such a case, a wavelength filter or an ND filter for setting the amount of light on the predetermined plane PP to be equal in the measurement period and the non-measurement period can be selected in accordance with the past records.

Figure 8:
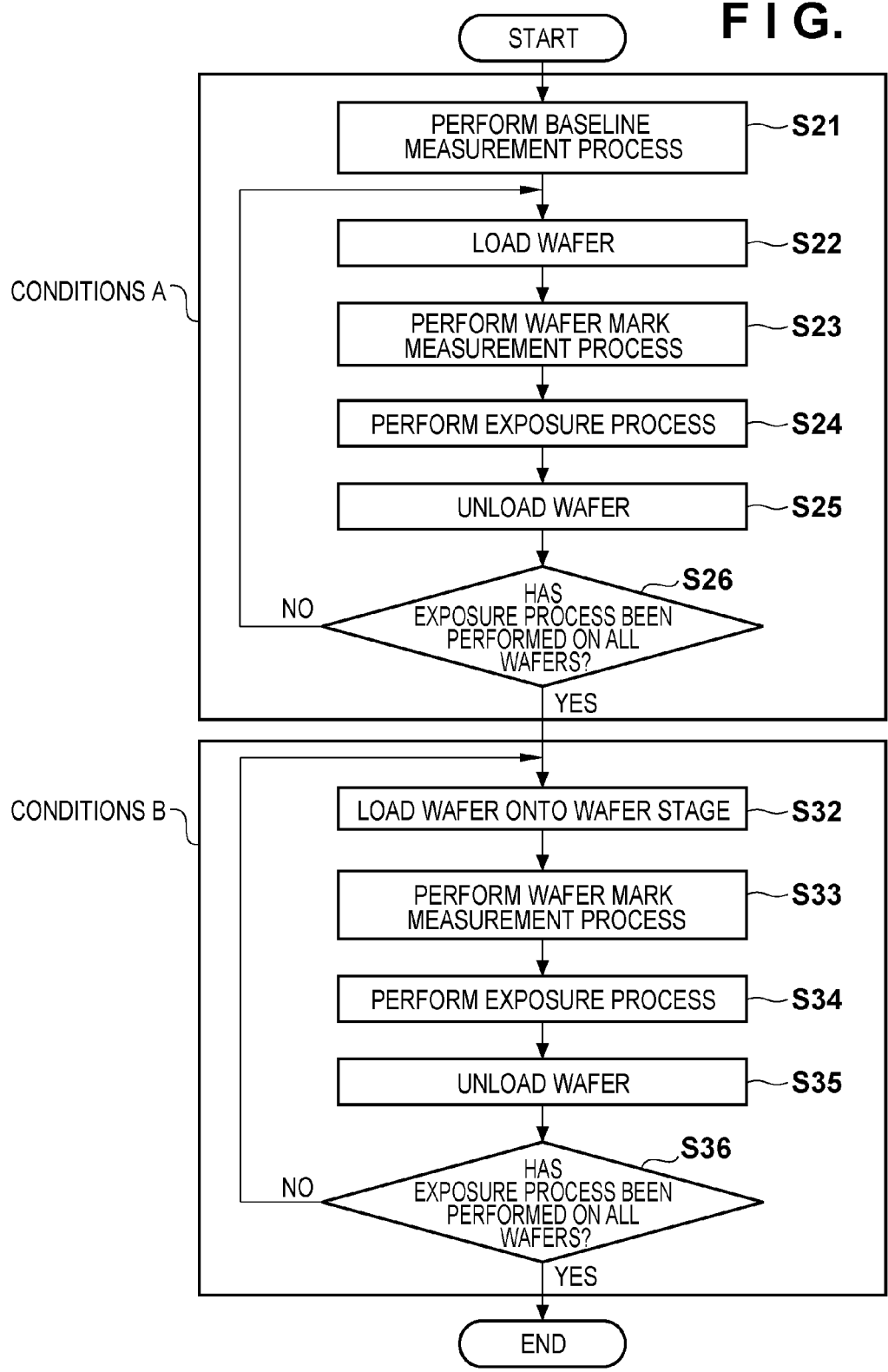
FIG. 8 is a flowchart showing the timings of an exposure process and a measurement process which uses the OA optical system in an exposure apparatus.

The operation of the exposure apparatus 100 will be described with reference to FIG. 8. FIG. 8 is a flowchart showing the timing of the operation of the exposure apparatus 100 and, especially, the timings of an exposure process and a measurement process which uses the OA optical system 24. Measurement conditions A and B shown in FIG. 8 represent those set in the OA optical system 24. The measurement conditions set in the OA optical system 24 include the optical conditions (for example, the amount of light) of the OA optical system 24, and are determined based on the process conditions of the wafer W and, especially, steps on the wafer mark WM and a resist applied onto the wafer W. How to process a wafer W under first process conditions and that under second process conditions will be described herein.

Referring to FIG. 8, in step S21, a measurement process (baseline measurement process) of measuring the baseline of the OA optical system 24 using the alignment optical system 23 and OA optical system 24, as described above, is performed. At this time, measurement conditions A (first measurement conditions) are set in the OA optical system 24. In step S22, a wafer W under first process conditions is loaded onto the wafer stage 20 (placed on it). In step S23, a measurement process (wafer mark measurement process) of measuring the position of the wafer mark WM on the wafer W, placed on the wafer stage 20, using the OA optical system 24, as described above, is performed. At this time, measurement conditions A are set in the OA optical system 24. In step S24, a process of transferring the pattern of the reticle 17 onto the wafer W, that is, an exposure process of exposing the wafer W to light is performed. Note that the exposure process includes an alignment process in which the wafer W (wafer stage 20) is positioned based on the position of the wafer mark WM measured in step S23. In step S25, the wafer W (that is, the wafer W having undergone the exposure process) is unloaded from the wafer stage 20. In step S26, it is determined whether the exposure process has been performed on all (for example, 25) wafers W under the first process conditions. If the exposure process has not yet been performed on all the wafers W under the first process conditions, the process returns to step S22, in which the next wafer W under the first process conditions is loaded onto the wafer stage 20. On the other hand, if the exposure process has been performed on all the wafers W under the first process conditions, the process advances to step S32.

In step S32, a wafer W under second process conditions is loaded onto the wafer stage 20. In step S33, a measurement process (wafer mark measurement process) of measuring the position of the wafer mark WM on the wafer W, placed on the wafer stage 20, using the OA optical system 24, as described above, is performed. At this time, measurement conditions B (second measurement conditions different from the first measurement conditions) are set in the OA optical system 24. In step S34, an exposure process of exposing the wafer W to light is performed. Note that the exposure process includes an alignment process in which the wafer W (wafer stage 20) is positioned based on the position of the wafer mark WM measured in step S33. In step S35, the wafer W is unloaded from the wafer stage 20. In step S36, it is determined whether the exposure process has been performed on all (for example, 25) wafers W under the second process conditions. If the exposure process has not yet been performed on all the wafers W under the second process conditions, the process returns to step S32, in which the next wafer W under the second process conditions is loaded onto the wafer stage 20. On the other hand, if the exposure process has been performed on all the wafers W under the second process conditions, the operation ends.

Referring to FIG. 8, the measurement period means each of the periods in which measurement processes, that is, the baseline measurement process (step S21) and wafer mark measurement processes (steps S23 and S33) are performed using the OA optical system 24. Also, the non-measurement period means each of the periods in which processes (steps S22, S24 to S26, S32, and S34 to S36) other than the measurement processes are performed. Moreover, the non-measurement period includes the following three periods:

Period 1: the period between repetitions of a wafer mark measurement process (that between previous step S23 and current step S23) of measuring the position of the wafer mark under measurement conditions A (first measurement conditions) when the wafer mark measurement process is repeatedly performed (steps S22 to S26) (the same applies to the period between repetitions of a wafer mark measurement process (that between previous step S33 and current step S33) of measuring the position of the wafer mark under measurement conditions B (second measurement conditions) when the wafer mark measurement process is repeatedly performed (steps S32 to S36));

Period 2: the period between a baseline measurement process (first process; step S21) of measuring the baseline of the OA optical system 24 and a wafer mark measurement process (second process; step S23) of measuring the wafer mark when the baseline measurement process and the wafer mark measurement process are performed; and Period 3: the period between a wafer mark measurement process (first process; step S23) of measuring the wafer mark under measurement conditions A and a wafer mark measurement process (second process; step S33) of measuring the wafer mark under measurement conditions B when these two wafer mark measurement processes are performed.

The exposure apparatus 100 according to this embodiment can reduce a change in temperature of the OA optical system 24 (that is, keep a change in temperature of the OA optical system 24 within a tolerance) in the measurement period, thereby allowing the OA optical system 24 to maintain high alignment performance, as described above. Hence, the exposure apparatus 100 can provide high-quality devices (for example, a semiconductor device, an LCD device, an image sensing device (for example, a CCD), and a thin-film magnetic head) by positioning the wafer W (wafer stage 20) with high accuracy based on the measurement result obtained by the OA optical system 24. These devices are fabricated through a step of exposing a substrate (for example, a wafer or a glass plate) coated with a photoresist (photosensitive agent) using the exposure apparatus 100, a step of developing the exposed substrate, and subsequent known steps.

Although an alignment light source has been described in this embodiment, the present invention is also applicable to a reference mark light source. Also, although a halogen lamp is used as the alignment light source in this embodiment, a laser diode or a He—Ne laser may be used. Moreover, the present invention is not limited to an OA optical system, and is applicable to a position measurement apparatus provided in an exposure apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2011-105652 filed on May 10, 2011, which is hereby incorporated by reference herein in its entirety.

What is claimed is:

1. A measurement apparatus for measuring a position of a mark, the measurement apparatus comprising:

an optical system configured to illuminate the mark with light emitted by a light source and to form an image of the mark using light reflected from the mark;
a detection system configured to detect the image of the mark; and
a control unit configured to control an amount of light on a predetermined plane of the optical system,
wherein the control unit sets an amount of light emitted by the light source to be smaller in a non-measurement period where the position of the mark is not measured than in a measurement period where the position of the mark is measured, and
wherein the control unit sets a transmittance in an optical path between the light source and the predetermined plane to be higher in the non-measurement period than in the measurement period in conjunction with setting the amount of light emitted by the light source.

2. The apparatus according to claim 1, wherein:
the optical system includes a plurality of filters having different transmittances, and the control unit selects a filter, among the plurality of filters, to be placed on the optical path between the light source and the predetermined plane of the plurality of filters so that a difference between the amount of light on the predetermined plane in the measurement period and the amount of light on the predetermined plane in the non-measurement period is reduced.

3. The apparatus according to claim 2, wherein the filter includes at least one of a wavelength filter or a neutral density filter.

4. The apparatus according to claim 3, wherein the optical system includes a fiber on which the light emitted by the light source and having passed through the filter enters.

5. The apparatus according to claim 1, wherein:
the optical system includes a plurality of illumination aperture stops having different aperture sizes, and
the control unit selects an illumination aperture stop, among the plurality of illumination aperture stops, to be placed on the optical path between the light source and the predetermined plane of the plurality of illumination aperture stops so that a difference between the amount of light on the predetermined plane in the measurement period and the amount of light on the predetermined plane in the non-measurement period is reduced.

6. A measurement for measuring a position of a mark, the measurement apparatus comprising:
an optical system configured to illuminate the mark with light emitted by a light source and to form an image of the mark using light reflected from the mark;
a detection system configured to detect the image of the mark;
at least one of a first sensor configured to detect an amount of light on a predetermined plane of the optical system or a second sensor configured to detect a temperature on the predetermined plane; and
a control unit configured to control the amount of light on the predetermined plane,
wherein the control unit sets an amount of light emitted by the light source to be smaller in a non-measurement period where the position of the mark is not measured than in a measurement period where the position of the mark is measured,
wherein the control unit sets a transmittance in an optical path between the light source and the predetermined plane to be higher in the non-measurement period than in the measurement period, and
wherein the control unit reduces a difference between the amount of light on the predetermined plane in the measurement period and the amount of light on the predetermined plane in the non-measurement period, based on the detection result obtained by the at least one of the first or second sensor.

7. A measurement for measuring a position of a mark, the measurement apparatus comprising:
an optical system configured to illuminate the mark with light emitted by a light source and to form an image of the mark using light reflected from the mark;
a detection system configured to detect the image of the mark;
a storage unit configured to store information indicating a temporal change in at least one of a temperature or an amount of light on a predetermined plane of the optical system; and
a control unit configured to control an amount of light on the predetermined plane,
wherein the control unit sets an amount of light emitted by the light source to be smaller in a non-measurement period where the position of the mark is not measured than in a measurement period where the position of the mark is measured,
wherein the control unit sets a transmittance in an optical path between the light source and the predetermined plane to be higher in the non-measurement period than in the measurement period, and
wherein the control unit reduces a difference between the amount of light on the predetermined plane in the measurement period and the amount of light on the predetermined plane in the non-measurement period, based on the information stored in the storage unit.

8. The apparatus according to claim 1, wherein:
the light source includes a halogen lamp, and
the control unit sets an amount of light emitted by the halogen lamp to be smaller in the non-measurement period than in the measurement period by setting an ON voltage of the halogen lamp to be smaller than in the non-measurement period than the measurement period.

9. The apparatus according to claim 1, wherein the light source includes a laser diode or a He—Ne laser.

10. The apparatus according to claim 1, wherein:
the optical system includes an objective lens, and
a position of the predetermined plane is set between the light source and the objective lens.

11. The apparatus according to claim 10, wherein the light that illuminates the mark passes through the objective lens and the light reflected from the mark passes though the objective lens.

12. An exposure apparatus for exposing a substrate on which a mark is formed, the exposure apparatus comprising:
(i) a measurement apparatus configured to measure a position of the mark, the measurement apparatus comprising:
an optical system configured to illuminate the mark with light emitted by a light source and to form an image of the mark using light reflected from the mark;
a detection system configured to detect the image of the mark; and
a control unit configured to control an amount of light on a predetermined plane of the optical system,
wherein the control unit sets an amount of light emitted by the light source to be smaller in a non-measurement period where the position of the mark is not measured than in a measurement period where the position of the mark is measured, and wherein the control unit sets a transmittance in an optical path between the light source and the predetermined plane to be higher in the non-measurement period than in the measurement period in conjunction with setting the amount of light emitted by the light source; and (ii) a positioning mechanism configured to position the substrate based on a position of the mark measured by the measurement apparatus.

13. A measurement apparatus for measuring a position of a first mark and a position of a second mark, the measurement apparatus comprising:
    an optical system configured to illuminate the first mark with light emitted by a light source and to form an image of the first mark using light reflected from the first mark, and configured to illuminate the second mark with the light emitted by the light source and to form an image of the second mark using light reflected from the second mark;
    a detection system configured to detect the image of the first mark and the image of the second mark; and
    a control unit configured to control an amount of light on a predetermined plane of the optical system,
    wherein the control unit sets an amount of light emitted by the light source to be smaller in a period from finishing measuring the position of the first mark until starting measuring the position of the second mark than in a period from starting measuring the position of the first mark until finishing measuring the position of the first mark, and
    wherein the control unit sets a transmittance in an optical path between the light source and the predetermined plane to be higher in the period from finishing measuring the position of the first mark until starting measuring the position of the second mark than in the period from starting measuring the position of the first mark unit finishing measuring the position of the first mark in conjunction with setting the amount of light emitted by the light source.

14. An exposure apparatus for exposing a substrate on which a mark is formed, the exposure apparatus comprising:
    a measurement apparatus configured to measure a position of the mark, the measurement apparatus including:
        an optical system configured to illuminate the mark with light emitted by a light source and to form an image of the mark using light reflected from the mark;
        a detection system configured to detect the image of the mark; and
        a control unit configured to control an amount of light on a predetermined plane of the optical system;
    a positioning mechanism configured to position the substrate based on the position of the mark measured by the measurement apparatus; and
    a projection optical system configured to project a pattern onto the substrate,
    wherein the control unit sets an amount of light emitted by the light source to be smaller in a period from finishing measuring a baseline between the optical system and the projection optical system until starting measuring the position of the mark than in a period from starting measuring the baseline until finishing measuring the baseline, and
    wherein the control unit sets a transmittance in an optical path between the light source and the predetermined plane to be higher in the period from finishing measuring the baseline until starting measuring the position of the mark than in the period from starting measuring the baseline until finishing measuring the baseline in conjunction with setting the amount of light emitted by the light source.

15. A device fabrication method comprising steps of:
    applying a photoresist on a substrate; and
    exposing the substrate on which the photoresist has been applied using an exposure apparatus for exposing the substrate on which a mark is formed,
    wherein the exposure apparatus includes:
        a measurement apparatus configured to measure a position of the mark; and
        a positioning mechanism configured to position the substrate based on the position of the mark measured by the measurement apparatus,
        wherein the measurement apparatus includes:
            an optical system configured to illuminate the mark with light emitted by a light source and to form an image of the mark using light reflected from the mark;
            a detection system configured to detect the image of the mark; and
            a control unit configured to control an amount of light on a predetermined plane of the optical system,
            wherein the control unit sets an amount of light emitted by the light source to be smaller in a non-measurement period where the position of the mark is not measured than in a measurement period where the position of the mark is measured, and
        wherein the control unit sets a transmittance in an optical path between the light source and the predetermined plane to be higher in the non-measurement period than in the measurement period in conjunction with setting the amount of light emitted by the light source.

16. A device fabrication method comprising steps of:
    applying a photoresist on a substrate; and
    exposing the substrate on which the photoresist has been applied using an exposure apparatus for exposing the substrate on which a mark is formed,
    wherein the exposure apparatus includes:
        a measurement apparatus configured to measure a position of the mark and including:
            an optical system configured to illuminate the mark with light emitted by a light source and to form an image of the mark using light reflected from the mark;
            a detection system configured to detect the image of the mark; and
            a control unit configured to control an amount of light on a predetermined plane;
        a positioning mechanism configured to position the substrate based on the position of the mark measured by the measurement apparatus; and
        a projection optical system configured to project a pattern onto the substrate,
        wherein the control unit sets an amount of light emitted by the light source to be smaller in a period from finishing measuring a baseline between the optical system and the projection optical system until starting measuring the position of the mark than in a period from starting measuring the baseline until finishing measuring the baseline, and
    wherein the control unit sets a transmittance in an optical path between the light source and the predetermined plane to be higher in the period from finishing measuring the baseline until starting measuring the position of the mark than in the period from staring measuring the baseline until finishing measuring the baseline in conjunction with setting the amount of light emitted by the light source.

17. A measurement method for of measuring a position of a mark, the method comprising steps of:
   illuminating the mark with light emitted by a light source and forming an image of the mark using light reflected from the mark, by an optical system;
   detecting the image of the mark;
   setting an amount of light emitted by the light source to be smaller in a non-measurement period where the position of the mark is not measured than in a measurement period where the position of the mark is measured; and
   setting a transmittance in an optical path between the light source and a predetermined plane of the optical system to be higher in the non-measurement period than in the measurement period in conjunction with setting the amount of light emitted by the light source.

18. A measurement apparatus for measuring a position of a mark, the apparatus comprising:
   an optical system configured to illuminate the mark with light emitted by a light source and to form an image of the mark using light reflected from the mark;
   a detection system configured to detect the image of the mark; and
   a control unit configured to control an ON voltage of the light source and a transmittance in an optical path between the light source and a predetermined plane of the optical system,
   wherein the control unit sets the ON voltage of the light source to be lower in a non-measurement period where the position of the mark is not measured than in a measurement period where the position of the mark is measured, and
   wherein the control unit sets the transmittance in the optical path between the light source and the predetermined plane to be higher in the non-measurement period than in the measurement period in conjunction with setting the ON voltage of the light source.

19. The apparatus according to claim 18, wherein the light source includes a halogen lamp, a laser diode, or a He—Ne laser.

20. A measurement apparatus for measuring a position of a mark, the apparatus comprising:
   an optical system configured to illuminate the mark with light emitted by a light source and to form an image of the mark using light reflected from the mark;
   a detection system configured to detect the image of the mark; and
   a control unit configured to control an ON voltage of the light source and a transmittance in an optical path between the light source and a predetermined plane of the optical system,
   wherein the control unit sets the transmittance in the optical path between the light source and the predetermined plane to be higher when the control unit sets the ON voltage of the light source to be lower in conjunction with setting the ON voltage of the light source.

21. A measurement apparatus for measuring a position of a mark, the apparatus comprising:
   an optical system configured to illuminate the mark with light emitted by a light source and to form an image of the mark using light reflected from the mark;
   a detection system configured to detect the image of the mark; and
   a control unit configured to control an ON voltage of the light source and a transmittance in an optical path between the light source and a predetermined plane of the optical system,
   wherein the control unit sets the transmittance in the optical path between the light source and the predetermined plane to be higher when the control unit sets the ON voltage of the light source to be lower in conjunction with setting the ON voltage of the light source, and
   wherein the control unit sets the transmittance in the optical path between the light source and the predetermined plane to be lower when the control unit sets the ON voltage of the light source to be higher in conjunction with setting the ON voltage of the light source.

* * * * *